US010991602B2

(12) United States Patent
Fukaya et al.

(10) Patent No.: US 10,991,602 B2
(45) Date of Patent: Apr. 27, 2021

(54) SUBSTRATE WASHING DEVICE (71) Applicant: EBARA CORPORATION, Tokyo (JP)

(72) Inventors: Koichi Fukaya, Tokyo (JP); Tomoatsu Ishibashi, Tokyo (JP); Hisajiro Nakano, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 223 days.

(21) Appl. No.: 15/589,695

(22) Filed: May 8, 2017

(65) Prior Publication Data
US 2017/0323809 A1 Nov. 9, 2017

(30) Foreign Application Priority Data

May 9, 2016 (JP) .............................. JP2016-093755
May 9, 2016 (JP) .............................. JP2016-093756

(51) Int. Cl.
*H01L 21/67* (2006.01)
*B08B 3/02* (2006.01)
*H01L 21/02* (2006.01)

(52) U.S. Cl.
CPC ........ *H01L 21/67051* (2013.01); *B08B 3/024* (2013.01); *H01L 21/67017* (2013.01); *B08B 3/02* (2013.01); *H01L 21/02052* (2013.01); *H01L 21/6708* (2013.01)

(58) Field of Classification Search
CPC ................................................ H01L 21/67051
See application file for complete search history.

(56) References Cited

U.S. PATENT DOCUMENTS

| 2003/0178047 | A1 | 9/2003 | Hirae | |
| 2006/0249182 | A1* | 11/2006 | Hayamizu | ................. B08B 3/02 134/34 |
| 2007/0141849 | A1 | 6/2007 | Kanno et al. | |
| 2008/0173327 | A1 | 7/2008 | Miyagi | |
| 2008/0251107 | A1* | 10/2008 | Osada | ............... H01L 21/67051 134/201 |
| 2012/0186607 | A1 | 7/2012 | Higashijima et al. | |
| 2012/0318304 | A1 | 12/2012 | Wang et al. | |
| 2013/0220368 | A1 | 8/2013 | Ishibashi | |

(Continued)

FOREIGN PATENT DOCUMENTS

| JP | 60-000876 | 1/1985 |
| JP | 2000-070887 | 3/2000 |
| JP | 2003-068692 | 3/2003 |

(Continued)

OTHER PUBLICATIONS

Japan Patent Application No. 2016-093756; Reasons for Refusal; dated Feb. 5, 2019; 6 pages.

(Continued)

*Primary Examiner* — Spencer E Bell
(74) *Attorney, Agent, or Firm* — BakerHostetler (57) ABSTRACT

A substrate washing device includes a substrate holding mechanism 70 that holds a substrate W, a substrate rotating mechanism 72 that rotates the substrate W held by the substrate holding mechanism 70, and a two-fluid nozzle 46 that ejects a two-fluid jet toward a surface of the rotating substrate W. The two-fluid nozzle 46 is formed of a conductive material. Accordingly, the electrification amount of droplets ejected as the two-fluid jet from the two-fluid nozzle 46 can be suppressed.

7 Claims, 12 Drawing Sheets

(56) References Cited

U.S. PATENT DOCUMENTS

2015/0348806 A1   12/2015   Ishibashi

FOREIGN PATENT DOCUMENTS

| | | |
|---|---|---|
| JP | 2004-235559 A | 8/2004 |
| JP | 2004-273799 A | 9/2004 |
| JP | 2005-294819 A | 10/2005 |
| JP | 2006-187707 | 7/2006 |
| JP | 2006-223995 | 8/2006 |
| JP | 2006-286947 A | 10/2006 |
| JP | 2007-150375 A | 6/2007 |
| JP | 2008-153322 | 7/2008 |
| JP | 2013-004705 | 1/2013 |
| JP | 2013-175496 A | 9/2013 |
| JP | 2013-214737 A | 10/2013 |
| JP | 2015-192088 A | 11/2015 |
| JP | 2015-201627 | 11/2015 |
| TW | 200833425 A | 8/2008 |
| WO | WO 2008/153107 A1 | 12/2008 |
| WO | WO 2015/147237 A1 | 10/2015 |

OTHER PUBLICATIONS

Office Action dated Jan. 15, 2019, issued in Japanese patent application 2016-093755, with English translation, 7 pages.
Singapore Patent Application No. 10201703546T; Search Report and Written Opinion; dated Oct. 29, 2019; 9 pages.
Singapore Patent Application No. 10201703546T; Supplementary Search Report; dated Feb. 5, 2020; 3 pages.
Japan Patent Application No. 2019-145906; Notice of Reasons for Refusal; dated Jun. 23, 2020; 10 pages.

* cited by examiner

SUBSTRATE WASHING DEVICE

CROSS-REFERENCE TO RELATED APPLICATIONS

This application claims the benefit of Japanese Priority Patent Applications JP 2016-093756 filed on May 9, 2016 and JP 2016-093755 filed on May 9, 2016, the entire contents of which are incorporated herein by reference.

FIELD

The present technology relates to a substrate washing device which washes a surface of a substrate by using a two-fluid jet.

BACKGROUND AND SUMMARY

As a method for washing a surface of a substrate in a noncontact manner, a washing method using a two-fluid jet (2FJ) has been conventionally known. In such 2FJ-washing, fine droplets (for example, pure water mist) included in high-speed gas (for example, $CO_2$ gas) are ejected from a two-fluid nozzle toward a surface of a substrate so as to collide with the surface, and particles, etc. on the surface of the substrate are removed (washed away) by using shock waves caused by collision of the droplets with the surface of the substrate (for example, see Japanese Patent Laid-Open No. 2005-294819).

In high speed 2FJ-washing, the flow rate of gas is high and the flow speed of gas is also high (200 m/sec or higher, and preferably, 250 m/sec or higher). For this reason, droplets being supplied to a surface of a substrate are likely to be electrified (compared to droplets in normal 2FJ-washing), because the gas and pure water or the droplets and the inner wall of a nozzle are brought into contact with each other at the time of ejection. Therefore, in high speed 2FJ-washing, the electrification amount of a surface of a substrate is likely to increase during the washing.

In conventional normal 2FJ-washing, $CO_2$ gas is mixed in advance into pure water to be supplied to a 2FJ nozzle, the $CO_2$ water is ionized to facilitate the flow of charges (electrons), so that the electrification amount of droplets is suppressed. However, in high speed 2FJ-washing, the electrification amount of droplets cannot be sufficiently suppressed by such a conventional method, and thus, adhesion of particles easily occurs due to an influence of electrification.

The present technology has been achieved in view of the aforementioned problems, and an object of the present technology is to provide a substrate washing device capable of inhibiting a surface of a substrate to be washed, from being electrified even during high speed 2FJ-washing.

A substrate washing device according to one embodiment includes a substrate holding mechanism that holds a substrate, a substrate rotating mechanism that rotates the substrate held by the substrate holding mechanism, and a two-fluid nozzle that ejects a two-fluid jet toward a surface of the rotating substrate, wherein the two-fluid nozzle is formed of a conductive material.

A substrate washing device according to another aspect includes a substrate holding mechanism that holds a substrate, a substrate rotating mechanism that rotates the substrate held by the substrate holding mechanism, a two-fluid nozzle that ejects a two-fluid jet toward a surface of the rotating substrate, and a specific-resistance adjusting mechanism that adjusts the specific resistance value of a washing liquid to be supplied to the two-fluid nozzle.

DETAILED DESCRIPTION OF NON-LIMITING EXAMPLE EMBODIMENTS

Hereinafter, a substrate washing device according to embodiments will be described. Each of the embodiments described below is merely an example for implementing the present technology, and the present technology is not limited to any of the specific configurations described below. Upon implementation of the present technology, a specific configuration corresponding to any of the embodiments may be employed as appropriate.

A substrate washing device according to one embodiment includes a substrate holding mechanism that holds a substrate, a substrate rotating mechanism that rotates the substrate held by the substrate holding mechanism, and a two-fluid nozzle that ejects a two-fluid jet toward a surface of the rotating substrate. The two-fluid nozzle is formed of a conductive material.

According to this configuration, the two-fluid nozzle is formed of the conductive material, and thus, the electrification amount of droplets ejected as the two-fluid jet from the two-fluid nozzle can be adjusted. Accordingly, even during high speed 2FJ-washing, the surface of the substrate to be washed can be inhibited from being electrified, and electrified particles can be inhibited from adhering to the substrate.

In the substrate washing device, the whole of the two-fluid nozzle may be formed of the conductive material.

According to this configuration, the whole of the two-fluid nozzle is formed of the conductive material, and thus, droplets (droplets that have been subjected to inhibition of electrification, or droplets that are slightly electrified) ejected from the two-fluid nozzle negatively electrify the surface of the substrate to be washed. According to the type of the substrate or the washing condition, it may be preferable that the substrate is negatively electrified. In this case, control to negatively electrify the droplets can be performed.

In the substrate washing device, the two-fluid nozzle may have a nozzle leading end formed of the conductive material, and a nozzle base end formed of a non-conductive material.

According to this configuration, the two-fluid nozzle has the nozzle leading end formed of the conductive material and the nozzle base end formed of the non-conductive material, and thus, droplets (droplets that have been subjected to inhibition of electrification, or droplets that are slightly electrified) ejected from the two-fluid nozzle positively electrify the surface of the substrate to be washed. Control to positively electrify the droplets can be performed by combining the nozzle materials in this way.

In the substrate washing device, the conductive material may be conductive carbon PEEK or conductive carbon PTFE.

According to this configuration, the two-fluid nozzle can be formed of the conductive material by using conductive carbon PEEK or conductive carbon PTFE. Thus, the electrification amount of the droplets ejected from the two-fluid nozzle can be suppressed.

In the substrate washing device, the ejection speed of the two-fluid jet may be at lowest 200 m/sec or higher, and preferably, 250 m/sec or higher.

According to this configuration, during high speed 2FJ-washing (2FJ-washing in which the ejection speed of droplets ejected as the two-fluid jet is at lowest 200 m/sec or higher, and preferably, 250 m/sec or higher), the surface of the substrate to be washed can be inhibited from being electrified.

A substrate washing device according to another embodiment includes a substrate holding mechanism that holds a substrate, a substrate rotating mechanism that rotates the substrate held by the substrate holding mechanism, a two-fluid nozzle that ejects a two-fluid jet toward a surface of the rotating substrate, and a specific-resistance adjusting mechanism that adjusts the specific resistance value of a washing liquid to be supplied to the two-fluid nozzle.

According to this configuration, the specific-resistance adjusting mechanism is used, and thus, the specific resistance value of a washing liquid (for example, $CO_2$ water) to be supplied to the two-fluid nozzle can be adjusted. When the washing liquid having a lower specific resistance value is supplied to the two-fluid nozzle, the electrification amount of droplets ejected from the two-fluid nozzle can be further inhibited. Accordingly, even during high speed 2FJ-washing, the surface of the substrate to be washed can be inhibited from being electrified, and electrified particles can be inhibited from adhering to the substrate.

The substrate washing device may include a flow-rate adjusting mechanism that adjusts the flow rate of the washing liquid being supplied to the two-fluid nozzle.

According to this configuration, the flow-rate adjusting mechanism is used, and thus, the flow rate of the washing liquid being supplied to the two-fluid nozzle can be adjusted. With the washing liquid being supplied to the two-fluid nozzle at a higher flow rate, the electrification amount of droplets ejected from the two-fluid nozzle can be suppressed. Accordingly, even during high speed 2FJ-washing, the surface of the substrate to be washed can be inhibited from being electrified, and electrified particles can be inhibited from adhering to the substrate.

The substrate washing device may include a rinse-liquid supply nozzle that supplies a rinse liquid toward the surface of the substrate, and the rinse-liquid supply nozzle may be capable of supplying the washing liquid to the surface of the substrate.

According to this configuration, not only the washing liquid is supplied from the two-fluid nozzle to the surface of the substrate, but also the washing liquid is supplied from the rinse-liquid supply nozzle to the surface of the substrate. Thus, the flow rate of the washing liquid being supplied to the surface of the substrate can be increased. With the washing liquid being supplied to the two-fluid nozzle at a higher flow rate, the electrification amount of the surface of the substrate can be further suppressed. Accordingly, even during high speed 2FJ-washing, the surface of the substrate to be washed can be inhibited from being electrified, and electrified particles can be inhibited from adhering to the substrate.

The substrate washing device may include a chemical-liquid supply nozzle that supplies a chemical liquid having conductivity toward the surface of the substrate.

According to this configuration, the chemical liquid having conductivity is supplied from the chemical-liquid supply nozzle to the surface of the substrate, and thus, the electrification amount of the surface of the substrate can be suppressed. Accordingly, even during high speed 2FJ-washing, the surface of the substrate to be washed can be inhibited from being electrified, and electrified particles can be inhibited from adhering to the substrate.

In the substrate washing device, the ejection speed of the two-fluid jet may be at lowest 200 m/sec or higher, and preferably, 250 m/sec or higher.

According to this configuration, during high speed 2FJ-washing (2FJ-washing in which the ejection speed of droplets as the fluid jet is at lowest 200 m/sec or higher, and preferably, 250 m/sec or higher), the surface of the substrate to be washed can be inhibited from being electrified.

Hereinafter, a substrate washing device according to embodiments of the present technology will be described with reference to the drawings. In each of the embodiments, a substrate washing device for use in washing of a semiconductor wafer, etc. will be exemplified.

First Embodiment

Figure 1:
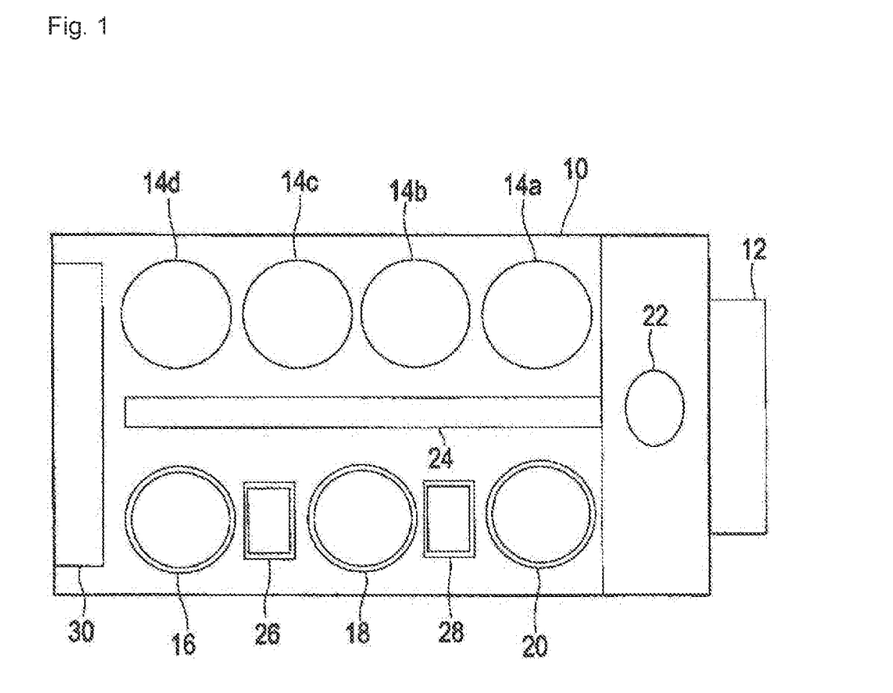
FIG. 1 is a plane view showing the entire configuration of a substrate processing apparatus provided with a substrate washing device (a substrate washing unit) of a first embodiment of the present technology.

The configuration of a substrate washing device according to a first embodiment of the present technology will be described with reference to the drawings. FIG. 1 is a plane view showing the entire configuration of a substrate processing apparatus provided with the substrate washing device (a substrate washing unit) of the present embodiment. As shown in FIG. 1, the substrate processing apparatus includes a housing 10 having a substantially rectangular shape, and a load port 12 in which a substrate cassette stocking therein multiple substrates for semiconductor wafers or the like is installed. The load port 12 is disposed adjacent to the housing 10. An open cassette, an SMIF (standard manufacturing interface) pod, or a FOUP (front opening unified pod) can be installed in the load port 12. The SMIF or FOUP is a sealed container capable of maintaining an environment independent from the external space, by covering, with a partitioning wall, the substrate cassette contained therein.

In the housing 10, a plurality of (four in the example in FIG. 1) polishing units 14*a* to 14*d*, a first washing unit 16 and a second washing unit 18 that wash the polished substrate, and a drying unit 20 that dries the washed substrate are contained. The polishing units 14*a* to 14*d* are aligned along the longitudinal direction of the substrate processing apparatus. The washing units 16 and 18 and the drying unit 20 are also aligned along the longitudinal direction of the substrate processing apparatus. The substrate washing device according to the present technology is applied as the second washing unit 18.

As shown in FIG. 1, a first substrate conveying robot 22 is disposed in a region surrounded by the load port 12, the polishing unit 14*a* at the load port 12 side, and the drying unit 20. In addition, a substrate conveying unit 24 is disposed in a direction parallel with the polishing units 14*a* to 14*d*. The first substrate conveying robot 22 receives an unpolished substrate from the load port 12 and passes the substrate to the substrate conveying unit 24, and receives the dried substrate from the drying unit 20 and returns the substrate to the load port 12. The substrate conveying unit 24 conveys the substrate received from the first substrate conveying robot 22 and exchanges the substrate with the polishing units 14*a* to 14*d*.

A second substrate conveying robot 26 that exchanges the substrate with the first washing unit 16 and the second washing unit 18 is disposed between the units 16 and 18. In addition, a third substrate conveying robot 28 that exchanges the substrate with the second washing unit 18 and the drying unit 20 is disposed between the units 18 and 20.

Further, in the housing 10, a control unit 30 that controls operations of the components of the substrate processing apparatus is disposed. The control unit 30 has a function of controlling an operation of the second washing unit (substrate washing device) 18.

In the present embodiment, a roll washing unit that washes the substrate by rubbing a roll washing member, which extends so as to have a roll-like shape, against both surfaces of the substrate in the presence of a washing liquid, is used as the first washing unit 16. The first washing unit (the roll washing unit) 16 is configured to also perform megasonic washing in which ultrasonic waves of approximately 1 MHz are applied to the washing liquid and a force caused by acceleration of vibration of the washing liquid is applied to fine particles adhering on the surface of the substrate.

The substrate washing device of the present technology is used as the second washing unit 18. A spin drying unit that holds the substrate, ejects IPA steam from a moving nozzle to dry the substrate, and rotates the substrate at high speed to further dry the substrate by a centrifugal force, is used as the drying unit 20. The washing part may have a vertical two-stage structure composed of the vertically arranged washing units 16 and 18. In this case, the washing part includes the two vertically arranged substrate processing units.

Figure 2:
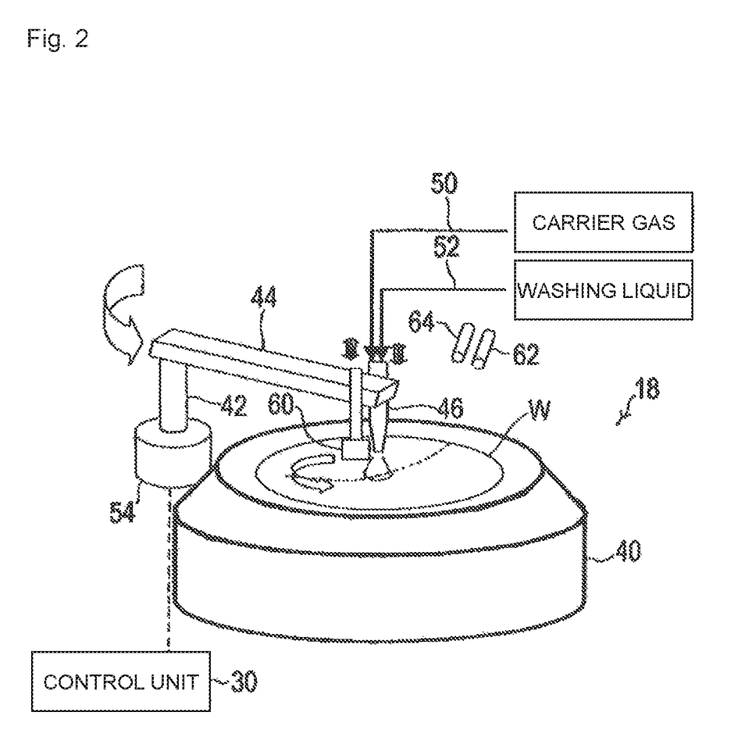
FIG. 2 is a perspective view showing the configuration of the substrate washing device (the substrate washing unit) of the first embodiment of the present technology.
Figure 3:
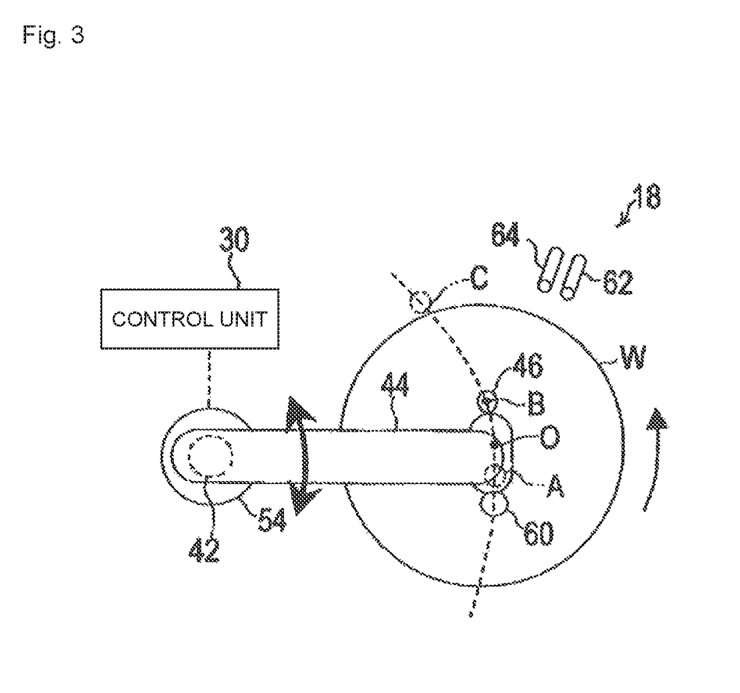
FIG. 3 is a plane view showing the configuration of the substrate washing device (the substrate washing unit) of the first embodiment of the present technology.

FIG. 2 is a perspective view showing the substrate washing device (the substrate washing unit) of the present embodiment. FIG. 3 is a plane view showing the substrate washing device (the substrate washing unit) of the present embodiment.

As shown in FIG. 2 and FIG. 3, the substrate washing device (the second washing unit) 18 of the present embodiment includes a washing tank 40 surrounding the circumference of the substrate W, a rotatable support shaft 42 standing from a lateral side of the washing tank 40, and an oscillation arm 44 having a base portion thereof on the upper end of the support shaft 42 and extending in the horizontal direction. In the washing tank 40, the substrate W is held by a chuck, etc. so as to be rotated by rotation of the chuck, etc. A two-fluid nozzle 46 is attached to a free end (leading end) of the oscillation arm 44 in a vertically movable manner.

A carrier gas supply line 50 through which carrier gas such as $N_2$ gas is supplied and a washing liquid supply line 52 through which a washing liquid such as pure water or $CO_2$ gas-dissolved water is supplied, are connected to the two-fluid nozzle 46. The carrier gas such as $N_2$ gas supplied into the two-fluid nozzle 46 and the washing liquid such as pure water or $CO_2$ gas-dissolved water supplied into the two-fluid nozzle 46 are ejected from the two-fluid nozzle 46 at high speed, and thereby, a two-fluid jet, in which the carrier gas includes fine droplets (mist) of the washing liquid, is generated. The two-fluid jet flow generated by the two-fluid nozzle 46 is ejected so as to collide with a surface of the rotating substrate W. Accordingly, particles and the like on the surface of the substrate can be removed (washed away) by using shock waves caused by collision of the fine droplets with the surface of the substrate.

The support shaft 42 is connected to a motor 54 serving as a driving mechanism that oscillates the oscillation arm 44 about the support shaft 42 by rotating the support shaft 42.

In this example, a pencil-type washing tool 60 formed of e.g., a PVA sponge is attached to the leading end of the oscillation arm 44 in a vertically movable and rotatable manner. At positions diagonally above the washing tank 40, a rinse-liquid supply nozzle 62 that supplies a rinse liquid to the surface of the rotating substrate W held by the chuck, etc., and a chemical-liquid supply nozzle 64 that supplies a chemical liquid to the surface are disposed. While the lower end of the pencil-type washing tool 60 is in contact with the surface of the rotating substrate W by a prescribed pressing force, the pencil-type washing tool 60 is moved by oscillation of the oscillation arm 44, and simultaneously, the rinse liquid or the chemical liquid are supplied to the surface of the substrate W. Accordingly, contact washing of the surface of the substrate W is performed. The aforementioned contact washing of the surface of the substrate W is not necessarily required and is performed as needed.

As shown in FIG. 3, in conjunction with oscillation of the oscillation arm 44, the two-fluid nozzle 46 moves from an offset position A, passes through a position above the center O of the substrate W and a position above a displacement point B apart from the center O by a prescribed distance, and reaches a washing end point C outside the outer circumference of the substrate W, along a circular movement trajectory. Accordingly, the surface of the substrate W is washed. During this washing, the two-fluid jet flow, in which the carrier gas includes the fine droplets (mist) of the washing liquid, is ejected from the two-fluid nozzle 46 toward the surface of the rotating substrate W. FIG. 3 shows a state where the two-fluid nozzle 46 is positioned above the displacement point B.

Figure 4:
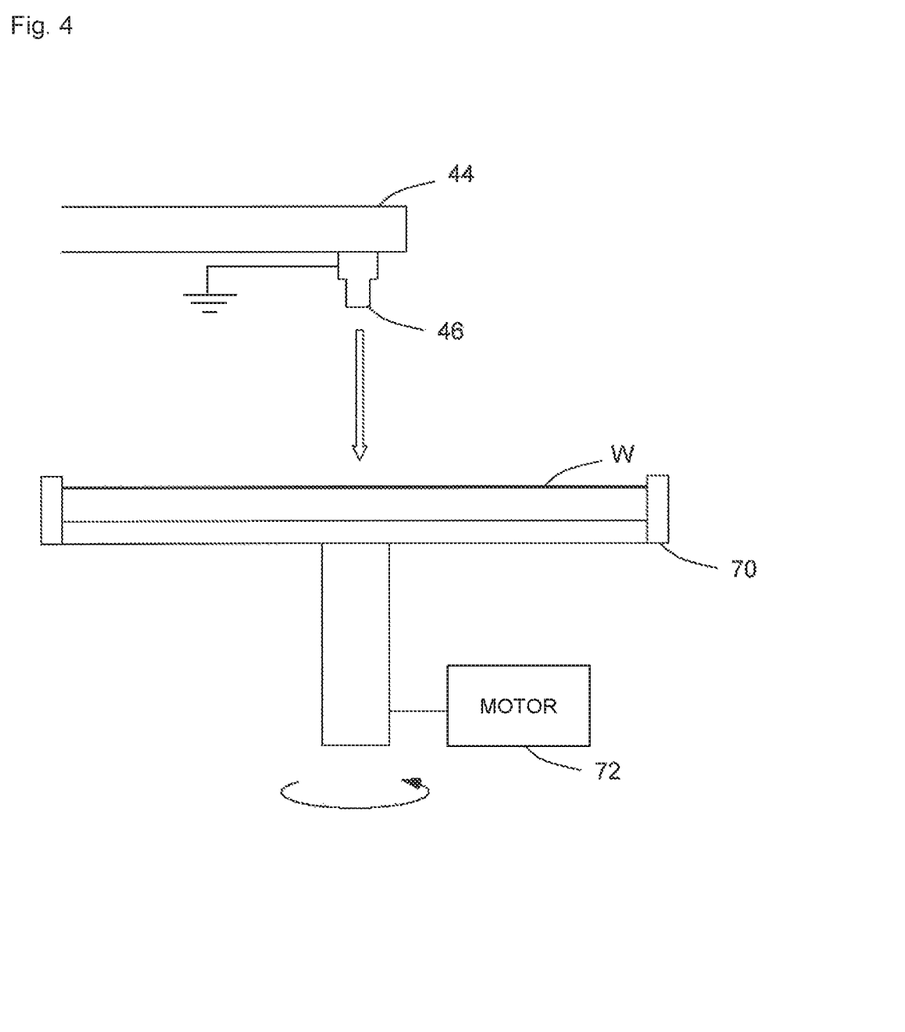
FIG. 4 is a side view showing the configuration of the substrate washing device (the substrate washing unit) of the first embodiment of the present technology.

Here, the configuration of the substrate washing device (the substrate washing unit) will be described in more detail with reference to the drawings. FIG. 4 is a side view showing the configuration of the substrate washing device (the substrate washing unit) of the present embodiment.

As shown in FIG. 4, the substrate washing device includes a substrate holding mechanism 70 that horizontally holds the substrate W, a motor (a rotating mechanism) 72 that rotates the substrate W about the center axis thereof via the substrate holding mechanism 70, and the two-fluid nozzle 46 that ejects a two-fluid jet toward the surface of the rotating substrate W. The two-fluid nozzle 46 of the present embodiment is an integrated type, and the whole of the nozzle is formed of a conductive material. For example, conductive carbon PEEK or conductive carbon PTFE is used as the conductive material. The two-fluid nozzle 46 is grounded. For example, the oscillation arm 44 that is formed of the conductive material may be grounded. In this case, the ejection speed of the two-fluid jet is at lowest 200 m/sec or higher, and preferably, 250 m/sec or higher. That is, the substrate washing device is used for high speed 2FJ-washing.

Figure 5:
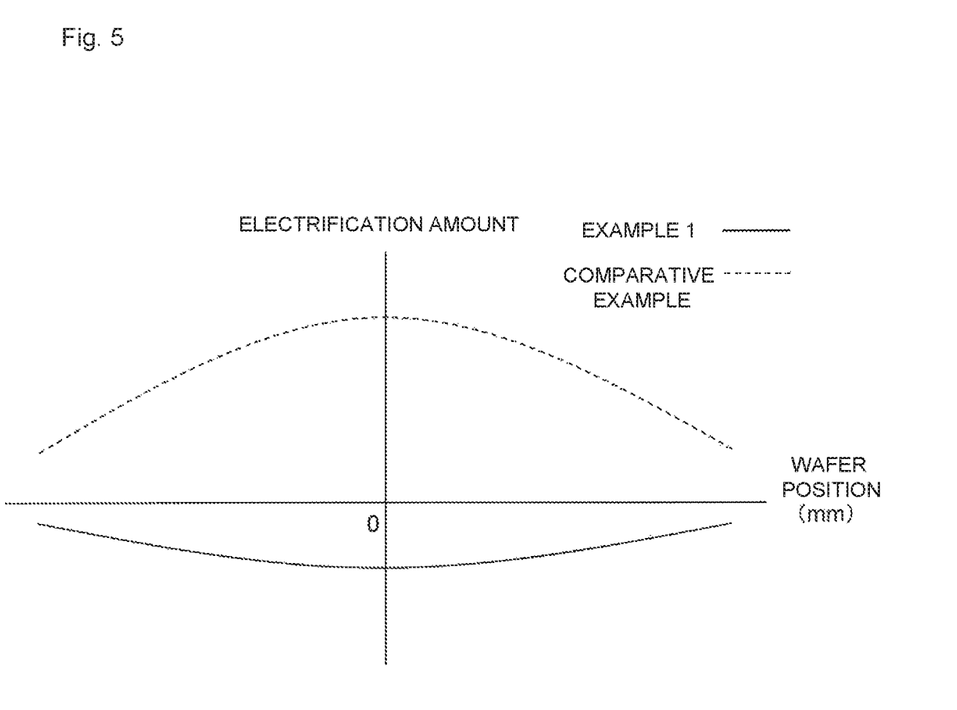
FIG. 5 is a diagram showing an electrification inhibiting effect provided by the substrate washing device (the substrate washing unit) of the first embodiment of the present technology.

FIG. 5 is a diagram showing an electrification inhibiting effect provided by the substrate washing device of the present embodiment. In FIG. 5, an example in which the whole of the nozzle is formed of the conductive material (conductive PEEK) is indicated by a solid line as "EXAMPLE 1", and an example in which the whole of the nozzle is formed of a non-conductive material (non-conductive PTFE) is indicated by a broken line as "COMPARATIVE EXAMPLE".

According to the substrate washing device of the first embodiment, as shown in FIG. 5, as a result of forming the two-fluid nozzle 46 of the conductive material, the electrification amount of droplets ejected as the two-fluid jet from the two-fluid nozzle 46 can be suppressed. Accordingly, even during high speed 2FJ-washing, the surface of the substrate W to be washed can be inhibited from being electrified, and electrified particles can be inhibited from adhering to the substrate W.

In the present embodiment, the whole of the two-fluid nozzle 46 is formed of the conductive material. Accordingly, as shown in FIG. 5, droplets (droplets that have been subjected to inhibition of electrification or droplets that are slightly electrified) ejected from the two-fluid nozzle 46 negatively electrify the surface of the substrate W to be washed. According to the type of the substrate W or the washing condition, it may be preferable that the substrate W is negatively electrified. In this case, control to negatively electrify the droplets can be performed.

Furthermore, in the present embodiment, the two-fluid nozzle 46 can be formed of the conductive material by using conductive carbon PEEK or conductive carbon PTFE. Thus, the electrification amount of droplets ejected from the two-fluid nozzle 46 can be suppressed.

Moreover, in the present embodiment, during high speed 2FJ-washing (2FJ-washing in which the ejection speed of droplets as the two-fluid jet is at lowest 200 m/sec or higher, and preferably, 250 m/sec or higher), the surface of the substrate W to be washed can be inhibited from being electrified.

Second Embodiment

Next, a substrate washing device according to a second embodiment of the present technology will be described. Here, the difference between the substrate washing device according to the second embodiment and the substrate washing device according to the first embodiment will be mainly described. Unless otherwise stated, the configuration and operations in the present embodiment are identical to those in the first embodiment.

Figure 6:
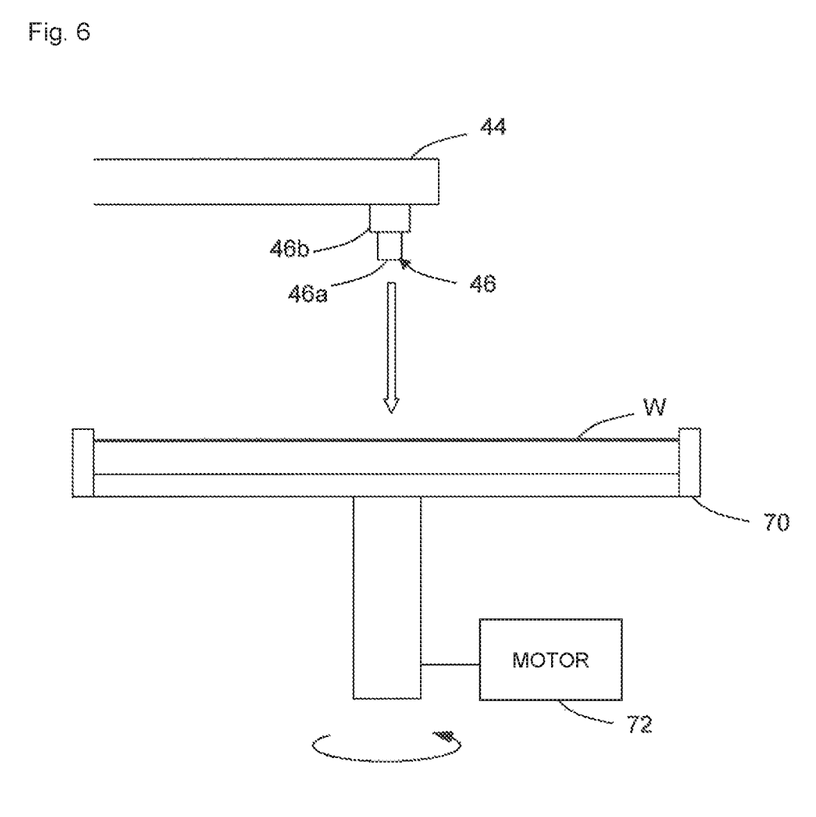
FIG. 6 is a side view showing the configuration of a substrate washing device (a substrate washing unit) of a second embodiment of the present technology.

FIG. 6 is a side view showing the configuration of the substrate washing device (the substrate washing unit) of the present embodiment. As shown in FIG. 6, the two-fluid nozzle 46 of the present embodiment is a separate type in which the nozzle is separated into a nozzle leading end 46a and a nozzle base end 46b. The nozzle leading end 46a is formed of a conductive material. The nozzle base end 46b is formed of a non-conductive material. For example, conductive carbon PEEK or conductive carbon PTFE is used as the conductive material. For example, non-conductive PTFE is used as the non-conductive material. Also in this case, the ejection speed of the two-fluid jet is at lowest 200 m/sec or higher, and preferably, 250 m/sec or higher. That is, the substrate washing device is also used for high speed 2FJ-washing.

Figure 7:
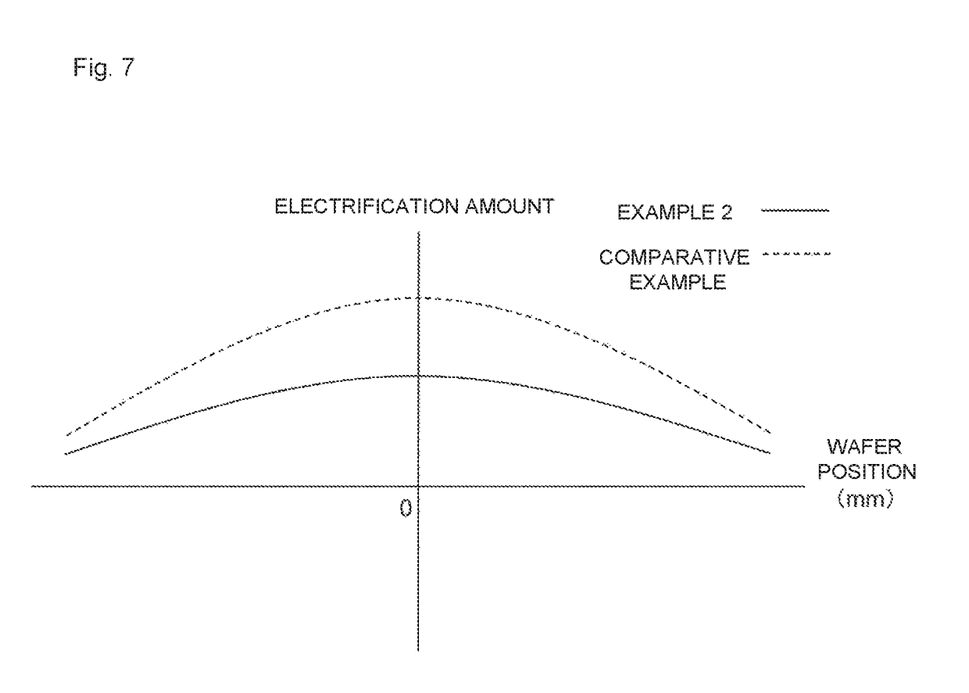
FIG. 7 is a diagram showing an electrification inhibiting effect provided by the substrate washing device (the substrate washing unit) of the second embodiment of the present technology.

FIG. 7 is a diagram showing an electrification inhibiting effect provided by the substrate washing device of the present embodiment. In FIG. 7, an example in which the nozzle leading end 46a is formed of the conductive material (conductive PEEK) and the nozzle base end 46b is formed of the non-conductive material (non-conductive PTFE) is indicated by a solid line as "EXAMPLE 2", and an example in which the whole of the nozzle is formed of the non-conductive material (non-conductive PTFE) is indicated by a broken line as "COMPARATIVE EXAMPLE".

The substrate washing device of the second embodiment also provides the effect same as that in the first embodiment. That is, as shown in FIG. 7, as a result of forming the two-fluid nozzle 46 of the conductive material, the electrification amount of droplets ejected as the two-fluid jet from the two-fluid nozzle 46 can be suppressed. Accordingly, even during high speed 2FJ-washing, the surface of the substrate W to be washed can be inhibited from being electrified, and electrified particles can be inhibited from adhering to the substrate W.

In the present embodiment, the nozzle leading end 46a of the two-fluid nozzle 46 is formed of the conductive material and the nozzle base end 46b of the two-fluid nozzle 46 is formed of the non-conductive material. Accordingly, as shown in FIG. 7, droplets (droplets that have been subjected to inhibition of electrification, or droplets that are slightly electrified) ejected from the two-fluid nozzle 46 positively electrify the surface of the substrate W to be washed. Control to positively electrify the droplets can be performed by combining the nozzle materials in this way.

Third Embodiment

Next, a substrate washing device according to a third embodiment of the present technology will be described. Here, the difference between the substrate washing device according to the third embodiment and the substrate washing device according to the first embodiment will be mainly described. Unless otherwise stated, the configuration and operations in the present embodiment are identical to those in the first embodiment.

Figure 8:
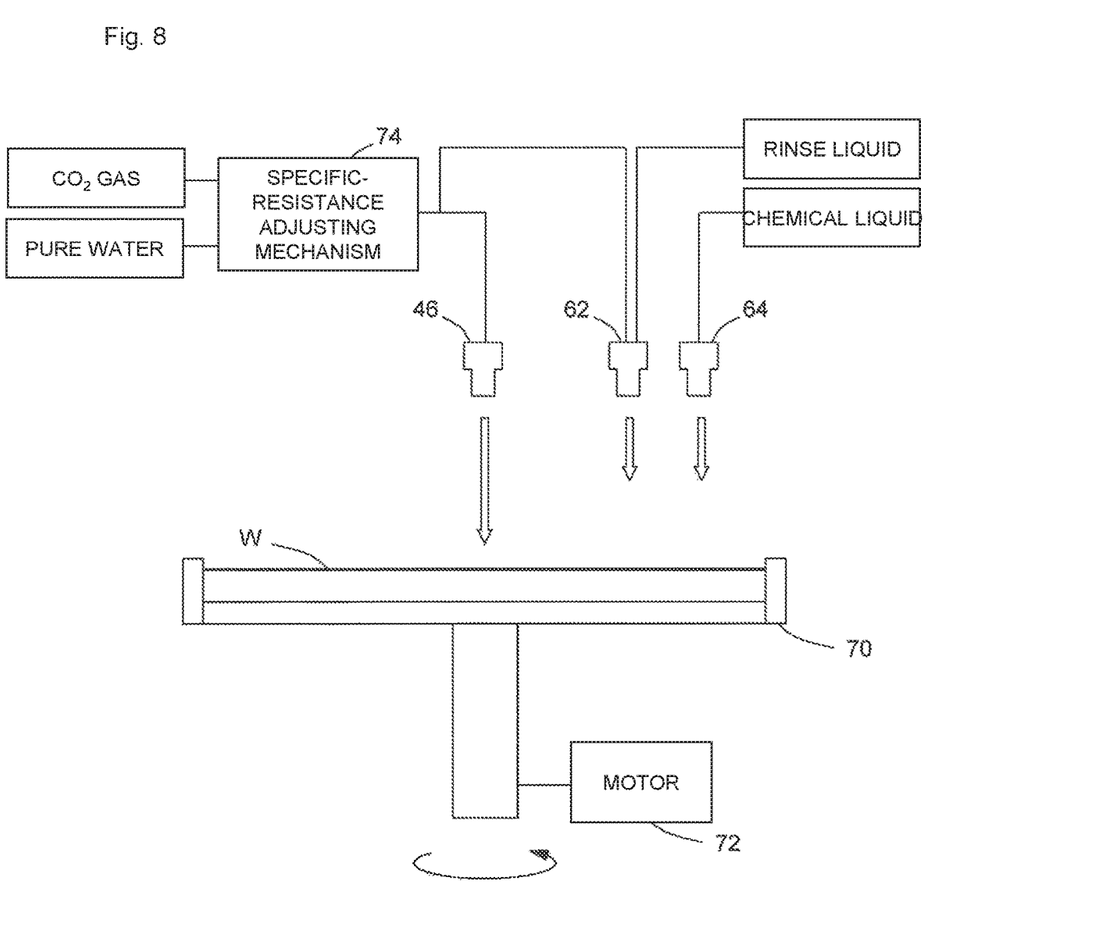
FIG. 8 is a side view showing the configuration of a substrate washing device (a substrate washing unit) of a third embodiment of the present technology.

FIG. 8 is a side view showing the configuration of the substrate washing device (the substrate washing unit) of the present embodiment. As shown in FIG. 8, the substrate washing device includes the substrate holding mechanism 70 that horizontally holds the substrate W, the motor (the rotating mechanism) 72 that rotates the substrate W about the central axis thereof via the substrate holding mechanism 70, the two-fluid nozzle 46 that ejects a two-fluid jet toward a surface of the rotating substrate W, and a specific-resistance adjusting mechanism 74 that adjusts the specific resistance value of a washing liquid to be supplied to the two-fluid nozzle 46. For example, $CO_2$ water obtained by mixing $CO_2$ gas into pure water in advance and ionizing the mixture is used as the washing liquid. The specific-resistance adjusting mechanism 74 can adjust the specific resistance value of the $CO_2$ water within a range of 0.1 to 18 MΩcm, for example. As the specific-resistance adjusting mechanism 74, a known mechanism may be used. In this case, the ejection speed of the two-fluid jet is at lowest 200 m/sec or higher, and preferably, 250 m/sec or higher. That is, the substrate washing device is used for high speed 2FJ-washing.

In addition, as shown in FIG. 8, the substrate washing device includes the rinse-liquid supply nozzle 62 that supplies a rinse liquid toward the surface of the substrate W, and the chemical-liquid supply nozzle 64 that supplies a chemical liquid toward the surface of the substrate. The rinse-liquid supply nozzle 62 is configured to supply a washing liquid ($CO_2$ water) to the surface of the substrate. Further, a chemical liquid having conductivity is used as the chemical liquid which is supplied from the chemical-liquid supply nozzle 64.

Here, a process flow of washing the substrate W with use of the substrate washing device will be described. After the substrate W is carried into the substrate washing device, first, the chemical liquid having conductivity is supplied from the chemical-liquid supply nozzle 64 to the surface of the substrate W, and thereafter, the two-fluid jet is ejected from the two-fluid nozzle 46, so that two-fluid washing is performed on the substrate W. The washing liquid ($CO_2$ water) used here has been adjusted by the specific-resistance adjusting mechanism 74 so as to have a low specific resistance. During two-fluid washing, it is preferably that the chemical liquid having conductivity is continuously supplied from the chemical-liquid supply nozzle 64. After completion of the two-fluid washing, the rinse liquid and the washing liquid ($CO_2$ water) are supplied from the rinse-liquid supply nozzle 62 to the surface of the substrate W, whereby, the chemical liquid is washed away.

Figure 9:
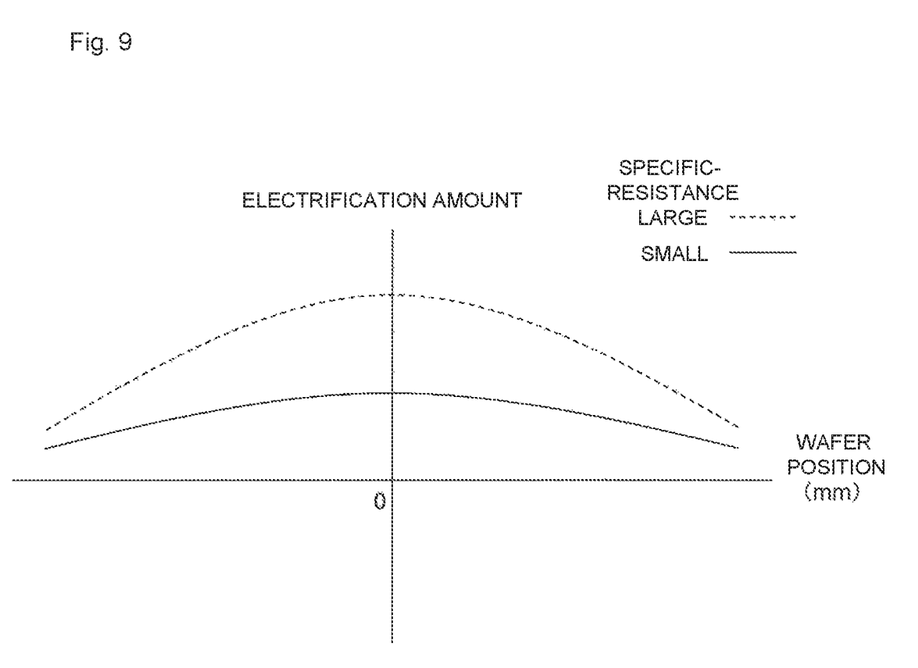
FIG. 9 is a diagram showing an electrification inhibiting effect provided by the substrate washing device (the substrate washing unit) of the third embodiment of the present technology.
Figure 10:
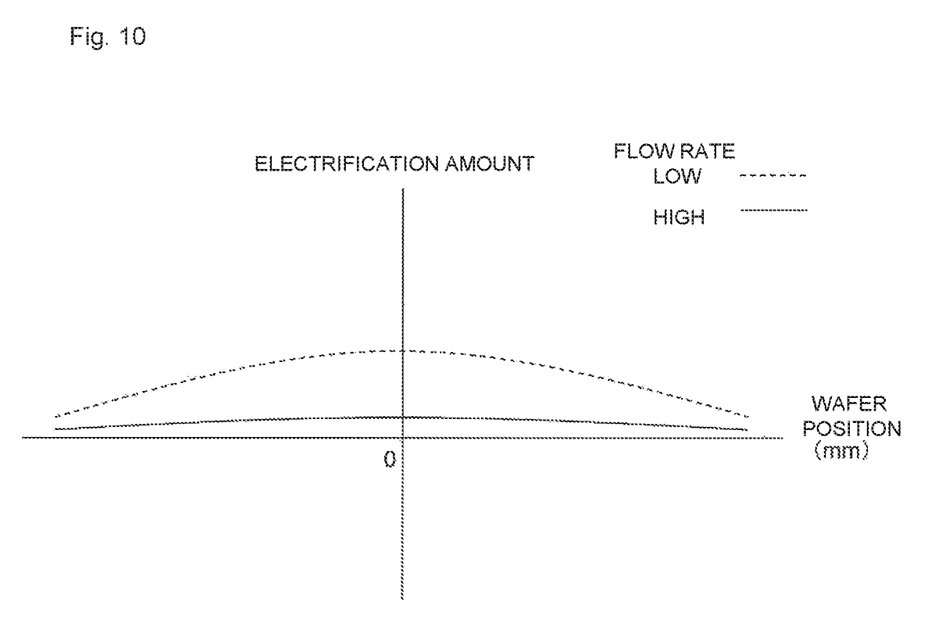
FIG. 10 is a diagram showing an electrification inhibiting effect provided by the substrate washing device (the substrate washing unit) of the third embodiment of the present technology.
Figure 11:
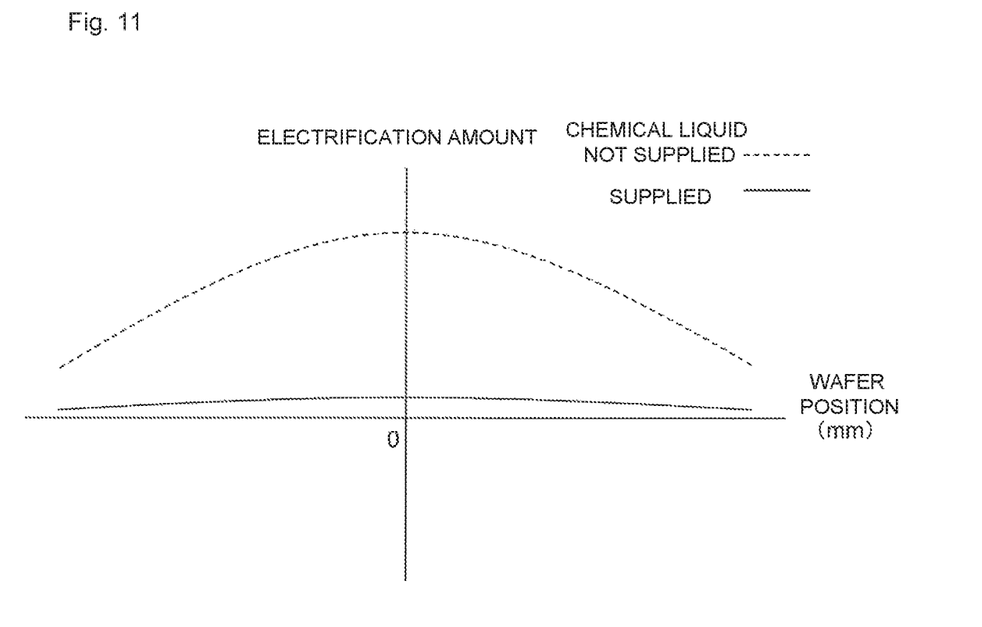
FIG. 11 is a diagram showing an electrification inhibiting effect provided by the substrate washing device (the substrate washing unit) of the third embodiment of the present technology.

FIGS. 9 to 11 are diagrams each showing an electrification inhibiting effect provided by the substrate washing device of the present embodiment. In FIG. 9, an example in which the washing liquid ($CO_2$ water) has a large specific resistance (for example, 18 MΩcm) is indicated by a broken line, and an example in which the washing liquid ($CO_2$ water) has a small specific resistance (for example, 0.1 MΩcm) is indicated by a solid line. In FIG. 10, an example in which the flow rate of the washing liquid being supplied to the surface of the substrate W is low (an example in which the washing liquid ($CO_2$ water) is not supplied from the rinse-liquid supply nozzle 62 either) is indicated by a broken line, and an example in which the flow rate of the washing liquid being supplied to the surface of the substrate W is high (the washing liquid ($CO_2$ water) is also supplied from the rinse-liquid supply nozzle 62) is indicated by a solid line. In FIG. 11, an example in which the chemical liquid having conductivity is not supplied to the surface of the substrate W is indicated by a broken line, and an example in which the chemical liquid having conductivity is supplied to the surface of the substrate W is indicated by a solid line.

According to the substrate washing device of the third embodiment, as a result of using the specific-resistance adjusting mechanism 74, the specific resistance value of the washing liquid (for example, $CO_2$ water) to be supplied to the two-fluid nozzle 46 can be adjusted. When the washing liquid having a lower resistance value is supplied to the two-fluid nozzle 46, the electrification amount of droplets ejected from the two-fluid nozzle 46 can be further suppressed. Accordingly, even during high speed 2FJ-washing, the surface of the substrate to be washed can be inhibited from being electrified, and electrified particles can be inhibited from adhering to the substrate.

In the present embodiment, not only the washing liquid is supplied from the two-fluid nozzle 46 to the surface of the substrate, but also the washing liquid is supplied from the rinse-liquid supply nozzle 62 to the surface of the substrate. Thus, the flow rate of the washing liquid being supplied to the surface of the substrate can be increased. With the washing liquid being supplied to the surface of the substrate at a higher flow rate, the electrification amount of the surface of the substrate can be further suppressed. Accordingly, even during high speed 2FJ-washing, the surface of the substrate to be washed can be inhibited from being electrified, and electrified particles can be inhibited from adhering to the substrate.

Furthermore, in the present embodiment, the chemical liquid having conductivity is supplied from the chemical-liquid supply nozzle 64 to the surface of the substrate, and thus, the electrification amount of the surface of the substrate can be suppressed. Accordingly, even during high speed 2FJ-washing, the surface of the substrate to be washed can be inhibited from being electrified, and electrified particles can be inhibited from adhering to the substrate.

Moreover, in the present embodiment, during high speed 2FJ-washing (2FJ-washing in which the ejection speed of the droplet as the two-fluid jet is at lowest 200 m/sec or higher, and preferably, 250 m/sec or higher), the surface of the substrate W to be washed can be inhibited from being electrified.

Fourth Embodiment

Next, a substrate washing device according to a fourth embodiment of the present technology will be described. Here, the difference between the substrate washing device according to the fourth embodiment and the substrate washing device according to the third embodiment will be mainly described. Unless otherwise stated, the configuration and operations in the present embodiment are identical to those in the third embodiment.

Figure 12:
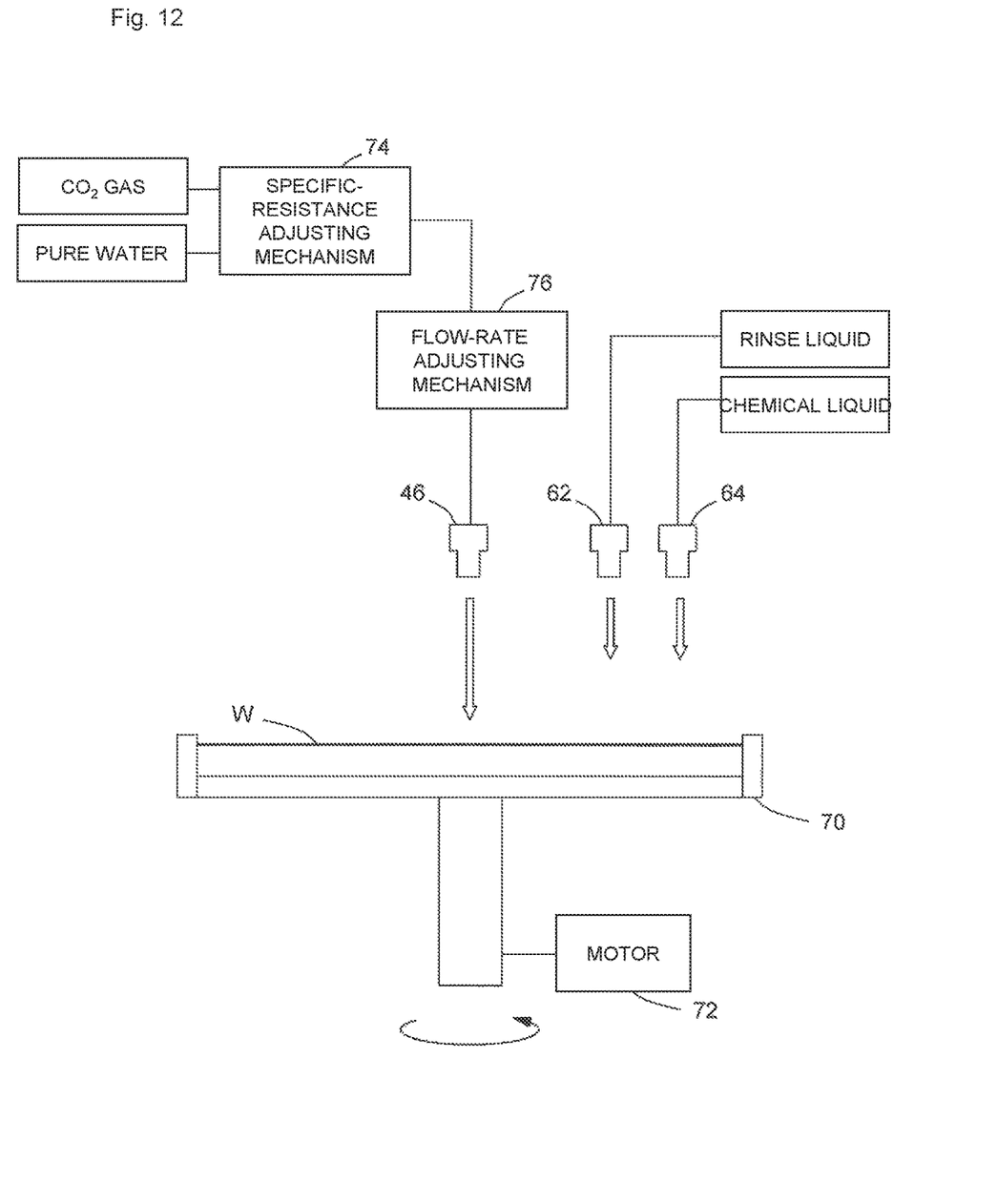
FIG. 12 is a side view showing the configuration of a substrate washing device (a substrate washing unit) of a fourth embodiment of the present technology.

FIG. 12 is a side view showing the configuration of the substrate washing device (the substrate washing unit) of the present embodiment. As shown in FIG. 12, the substrate washing device of the present embodiment includes a flow-rate adjusting mechanism 76 that adjusts the flow rate of the washing liquid being supplied to the two-fluid nozzle 46. As the flow-rate adjusting mechanism 76, a known mechanism may be used. For example, the flow-rate adjusting mechanism 76 is formed of a flow-rate adjusting valve or the like. Also in this case, the ejection speed of the two-fluid jet is at lowest 200 m/sec or higher, and preferably, 250 m/sec or higher. That is, the substrate washing device is also used for high speed 2FJ-washing.

The substrate washing device of the fourth embodiment also provides the effect same as that in the third embodiment. That is, as shown in FIGS. 9 to 11, as a result of forming the two-fluid nozzle 46 of the conductive material, the electrification amount of droplets ejected as the two-fluid jet from the two-fluid nozzle 46 can be suppressed. Accordingly, even during high speed 2FJ-washing, the surface of the substrate W to be washed can be inhibited from being electrified, and electrified particles can be inhibited from adhering to the substrate W.

In the present embodiment, as a result of using the flow-rate adjusting mechanism 76, the flow rate of the washing liquid being supplied to the two-fluid nozzle 46 can be adjusted. With the washing liquid being supplied to the two-fluid nozzle 46 at a higher flow rate, the electrification amount of droplets ejected from the two-fluid nozzle 46 can be further suppressed. Accordingly, even during high speed 2FJ-washing, the surface of the substrate to be washed can be inhibited from being electrified, and electrified particles can be inhibited from adhering to the substrate.

The embodiments of the present technique have been described above by the exemplification. However, the scope of the present technique is not limited to those embodiments. The present technique can be changed and modified within the scope of the claims.

What is claimed is:

1. A substrate washing device comprising:
a substrate holding mechanism that holds a substrate;
a substrate rotating mechanism that rotates the substrate held by the substrate holding mechanism; and
a two-fluid nozzle that ejects a two-fluid jet including droplets toward a surface of the rotating substrate, wherein
the two-fluid nozzle has a nozzle leading end formed of a conductive material and a nozzle base end formed of a non-conductive material, the conductive material being conductive carbon PEEK or conductive carbon PTFE, wherein the nozzle leading end is configured to discharge liquid external to the nozzle,
the two-fluid nozzle is configured to eject the droplets together with carrier gas, the droplets being positively electrified without adding charge from an external source, wherein the carrier gas and the liquid are mixed to form the droplets inside the nozzle and wherein
the substrate washing device further comprises an oscillation arm having the two-fluid nozzle on its leading end, the two-fluid nozzle being moved by the oscillation arm and facing the substrate.

2. The substrate washing device according to claim 1, wherein the ejection speed of the two-fluid jet is at lowest 200 m/sec or higher, and preferably, 250 m/sec or higher.

3. The substrate washing device according to claim 1, wherein the two-fluid nozzle is moved along a circular movement trajectory on the substrate,
the oscillation arm has a support shaft on its base end, the support shaft being connected with the oscillation arm rotatably.

4. The substrate washing device according to claim 3, wherein
the oscillation arm further comprising a pencil-type washing tool on its base end.

5. The substrate washing device according to claim 1, further comprising a control unit which controls the substrate washing device.

6. A substrate processing apparatus, comprising:
a plurality of polishing units;
a first washing unit and a second washing unit that wash the polished substrate; and
a drying unit that dries the washed substrate;
wherein the second washing unit comprises the substrate washing device according to claim 1.

7. A substrate processing apparatus according to claim 6, wherein the first washing unit and the second washing unit are housed in a washing part;
wherein the washing part has a two-stage structure composed of the first washing unit and the second washing unit, respectively, wherein the first washing unit and the second washing unit are arranged vertically to each other.

* * * * *